US006849843B2

(12) United States Patent
Ansorge et al.

(10) Patent No.: US 6,849,843 B2
(45) Date of Patent: Feb. 1, 2005

(54) FOCAL SURFACE AND DETECTOR FOR OPTO-ELECTRONIC IMAGING SYSTEMS, MANUFACTURING METHOD AND OPTO-ELECTRONIC IMAGING SYSTEM

(75) Inventors: Fank Ansorge, Munich (DE); Siegfried Craubner, Wessling (DE); Michael Feil, Munich (DE); Willi Platz, Munich (DE); Helmut Riedel, Fuerstenfeldbruck (DE)

(73) Assignee: Astrium GmbH, München (DE)

( * ) Notice: Subject to any disclaimer, the term of this patent is extended or adjusted under 35 U.S.C. 154(b) by 187 days.

(21) Appl. No.: 09/776,343

(22) Filed: Feb. 2, 2001

(65) Prior Publication Data

US 2001/0020671 A1 Sep. 13, 2001

(30) Foreign Application Priority Data

Feb. 4, 2000 (DE) ......................................... 100 04 891

(51) Int. Cl.[7] ............................................. H01L 27/00
(52) U.S. Cl. .................................. 250/208.1; 250/214.1
(58) Field of Search .......................... 250/208.1, 214.1, 250/214 R; 257/184, 191, 214, 257, 291–293

(56) References Cited

U.S. PATENT DOCUMENTS

| | | | | |
|---|---|---|---|---|
| 5,510,273 A | * | 4/1996 | Quinn ......................... | 156/160 |
| 5,654,549 A | * | 8/1997 | Landecker et al. .......... | 250/332 |
| 5,818,035 A | * | 10/1998 | Krivanek et al. ......... | 250/208.1 |
| 5,991,467 A | * | 11/1999 | Kamiko ...................... | 382/312 |
| 6,285,035 B1 | * | 9/2001 | Taravade ................ | 250/559.22 |
| 6,285,400 B1 | * | 9/2001 | Hokari ........................ | 348/374 |
| 6,486,917 B2 | * | 11/2002 | Iwasaki ...................... | 348/375 |

FOREIGN PATENT DOCUMENTS

| DE | 35 34 187 | 6/1994 |
|---|---|---|
| DE | 195 32 119 | 3/1997 |

* cited by examiner

*Primary Examiner*—Edward J. Glick
*Assistant Examiner*—Hoon Song
(74) *Attorney, Agent, or Firm*—Kenyon & Kenyon

(57) ABSTRACT

The focal surface for an opto-electronic imaging system includes an arrangement of detectors for image recording and a detector carrier or a FPA carrier for holding the detectors. The detectors are each made of at least one solid state element that is bonded to a flexible carrier substrate. The focal surface, or the detectors, respectively, exhibits a curvature, such that a curved field of view can be recorded. In a method for manufacturing a focal surface for opto-electronic imaging systems, at least one solid state element is bonded to a flexible carrier substrate to form flexible detectors, whereby a detector carrier provides a curvature and the flexible detectors are adapted to the curvature of the detector carrier. To manufacture a detector according to the present invention, a solid state element is thinned and bonded to a flexible carrier substrate, such that it is formed in a flexible manner and can be adapted to a curvature of a field of view. An opto-electronic imaging system according to the present invention with front optics for capturing an image and a detector arrangement that is arranged in a focal surface of the front optics, in which the detector arrangement is arranged in the focal surface in a curved manner.

17 Claims, 7 Drawing Sheets

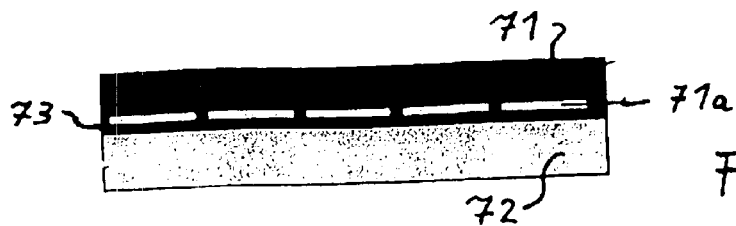
Fig. 9a
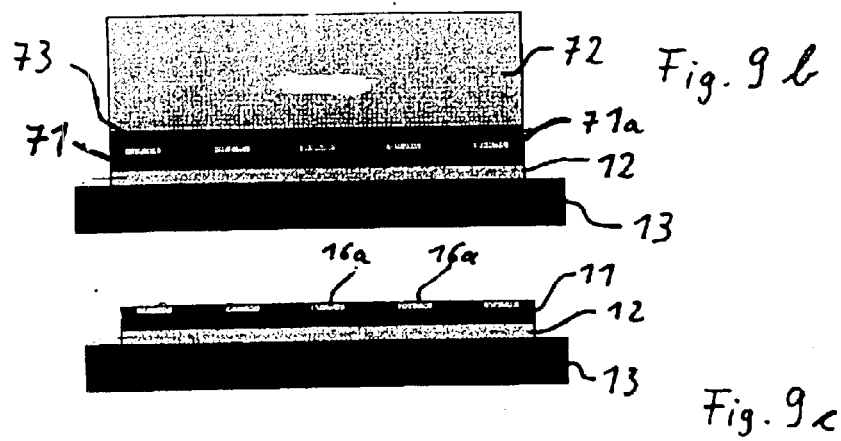
Fig. 9b
Fig. 9c
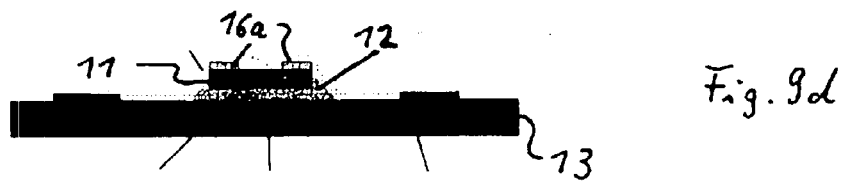
Fig. 9d
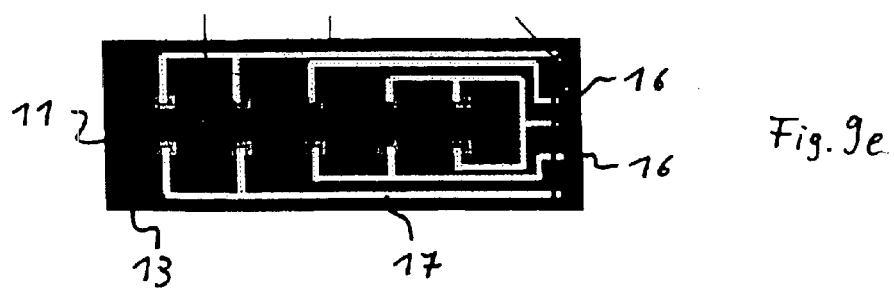
Fig. 9e

FOCAL SURFACE AND DETECTOR FOR OPTO-ELECTRONIC IMAGING SYSTEMS, MANUFACTURING METHOD AND OPTO-ELECTRONIC IMAGING SYSTEM

FIELD OF THE INVENTION

The present invention relates to a focal surface for opto-electronic imaging systems, a method for manufacturing a focal surface, a method for manufacturing a detector, a detector and an opto-electronic imaging system.

BACKGROUND INFORMATION

Opto-electronic imaging systems are used, for example, in the field of space technology, for earth observation, in reconnaissance systems or in automotive engineering for recognizing obstacles. The sensor head of opto-electronic systems consists of front optics, for example, a lens objective or a telescope, detectors in the focal plane and electronics. The front optics, for example, reflecting telescopes as often used for space instruments have a curved image plane or a curved focal plane. However, conventional detector technology requires a planar design. To flatten the image surface, so-called field correctors or field flatteners must, therefore, be connected downstream of the telescopes or optics in order to be able to place a planar detector surface into the focal surface. In general, the field correctors consist of lens assemblies that can typically effect a correction of the image plane only in a limited region over the field of view.

FIG. 4 illustrates a conventional Cassegrain system that can be used as a reflecting telescope for space instruments. FIG. 5 illustrates the curved focal surface of a concave mirror. FIG. 6 illustrates a Quasi-Ritchey-Chrétien booster system with a conventional field corrector or its beam paths, respectively.

However, in many applications, a broad field of view is required, for example to achieve a broad swath width. A corresponding expansion of the visual field of the telescope is particularly required in a scanning pushbroom instrument. For reasons of stability, particularly to withstand the launching loads, reflecting telescopes are primarily used for geometric high-resolution space instruments. Furthermore, in many cases a broadband spectral sensitivity is required.

The detectors in the focal plane are the hearts of opto-electronic imaging systems. For example, conventional CCD detectors are often used as well as CMOS detectors with active pixel technology. These detectors have an integrated readout electronics and can be manufactured in one manufacturing process.

In the field of automotive engineering, cameras used for recognizing obstacles are required to have a large visual field or panorama cameras are used. However, these require complicated optics to achieve a large visual field and to reduce distortions. Correspondingly, the price for a camera or an imaging system for such applications is very high.

To achieve a better reproduction quality, very narrow thermo-mechanical tolerances are also required. The field correctors often restrict the spectral transmission range, which is caused, for example, by the narrow transmission range of the employed lens glasses.

Overall, the conventional opto-electronic imaging systems or detector designs exhibit significant disadvantages, such as the restriction of the field of view and the limitations of spectral transmission properties of the telescopes, a complex design with field correctors to create planar image planes, complicated and elaborate front optics and high costs.

Therefore, the objectives of the present invention include overcoming the aforementioned disadvantages, simplifying opto-electronic imaging systems and enabling wider fields of view (FOV).

SUMMARY

The above and other beneficial objects of the present invention are achieved by providing the focal surface for opto-electronic imaging systems, the method for manufacturing a focal surface, the method for manufacturing a detector, the detector for image recording and the opto-electronic imaging system as described herein.

According to the present invention, a focal surface for opto-electronic imaging systems is created, using an arrangement of detectors for image recording and a substrate for holding the detector, whereby each detector is made of at least one solid state element, such as a semiconductor element, that is connected to a flexible carrier substrate, and whereby the focal surface and/or the detectors exhibit a curvature for recording a curved image plane. This renders field correctors for the creation of planar image planes unnecessary, thus simplifying the front optics of the imaging system. They can be made thermo-mechanically more robust. Wider fields of view become possible, that may be at 15° with a Schmidt telescope, for example, because there are no more field correctors that would otherwise limit the visual field. Furthermore, broadband spectral transmission properties of the telescopes or front optics are retained.

The detectors are preferably made of solid state material, e.g. semiconductor material, such as thinned silicon wafers, and arranged in a curved manner at the focal surface. More particularly, the detectors are made using an auxiliary carrier that is connected to the solid state element for the thinning of the solid state element and that can be or is removed after the thinning. In this manner, the silicon element, or the detector, may be made especially thin and flexible, such that a respective large curvature may be achieved. The result is a high flexibility or bendability of the detectors and of the focal surface.

The solid state element or elements may have a thickness in a range of up to a maximum of approximately 20 $\mu$m, and, more particularly, in a range of approximately 10 $\mu$m or less. The detectors may be flexible and particularly designed as CMOS line detectors, CCD or other solid state line detectors or as two-dimensional array detectors. In this manner, flexible and curved or curvable detectors with an integrated readout electronics may be made using CMOS technology in a cost-effective manner.

The focal surface may include an actuator for variable curving of the detectors or of the focal surface. This enables an active control of the flexible, curved focal planes. New telescope designs may be implemented that exhibit improved optical qualities, are simple in design and/or require fewer components.

In particular, the focal surface may be equipped with a temperature control system to maintain the detectors within a defined temperature range. For this purpose, the detector carrier may include channels for a cooling medium or may be coupled to peltier elements. This reduces the sensitivity to temperature fluctuations, that is, the focal surface and, therefore, the imaging system equipped with such a focal surface are thermo-mechanically more robust.

For the method according to the present invention for manufacturing a focal surface for opto-electronic imaging systems, a detector carrier is provided with a detector arrangement for image recording, whereby at least one solid state element, such as a semiconductor element, is connected with each flexible carrier substrate for forming flexible detectors, and whereby the detector carrier includes a curvature and the flexible detectors are adapted to the curvature of the detector carrier. This method enables the creation of focal surfaces that do not require field correctors when employed in opto-electronic imaging systems. The method may be performed in a cost-effective manner employing micro-mechanic technology. The method provides for the creation of opto-electronic imaging systems or focal surfaces that enable larger FOVs, improved optical properties and a simplified design. Furthermore, the optical elements such as lenses, telescopes, etc. may be made simply and with a reduced weight.

The solid state element, e.g., a silicon element, may be thinned when using the method according to the present invention.

According to an additional aspect of the invention, a method for manufacturing a detector for opto-electronic imaging systems is provided, in which at least one solid state element is thinned and connected to a flexible carrier substrate such that it has a flexible structure or may be adapted to the curvature of a field of view. With the method according to the present invention, it is possible to create flexible detectors or detectors that are curved or may be curved to enable their use in focal surfaces and in opto-electronic imaging systems without the need for field correctors.

The following, additional method steps may be performed with the method according to the present invention for manufacturing a focal surface and the method according to the present invention for manufacturing a detector:

For thinning the solid state element, the element may be connected to an auxiliary carrier, whereby the auxiliary carrier is or may be removed after thinning, for example. Thus, the thickness of the solid state elements may be substantially reduced and their flexibility substantially increased, thereby resulting in a low number of rejects.

Thinning, or reducing the thickness of the solid state element may be achieved by removal, for example, through grinding, etching, spin etching, chemical mechanical polishing (CMP), or a combination thereof. Depending on the application, it is possible to achieve high removal rates, e.g., with grinding, medium removal rates, e.g., with spin etching, or a very high precision, e.g., with the CMP method.

According to these methods, the solid state element is initially present as a wafer, and the wafer is thereafter or later split into chips, for example, prior to bonding with the carrier substrate. This enables a very cost-effective production.

The solid state elements may be provided with electrical contacts using isoplanar contacting technology. This allows for providing even extremely thin chips with contacts without the risk of destroying the chip, because no local high-pressure forces are present, as is the case with bond dies, for example.

The solid state element may be provided with a transparent coating that distinctly reduces the sensitivity to breaking.

According to yet another aspect of the present invention, a detector for image recording that is made of a solid state element, such as a semiconductor element, is created, whereby the solid state element is thinned and connected to a flexible carrier substrate, and whereby the detector is flexible. With the detector according to the present invention, it is possible to create focal surfaces for imaging systems that can be structured in a curved manner such that corresponding imaging systems do not require field correctors.

The solid state element may have a thickness in the range of less than approximately 50 $\mu$m, such as less than approximately 20 $\mu$m or approximately 10 to 20 $\mu$m. The length/width ratio of the solid state element may be in a range of approximately 20 to 60, such as approximately 40. This ratio may be, for example, greater than 20.

The detector may be made using the method according to the present invention as described above.

An opto-electronic imaging system may be created according to the present invention with front optics for recording the image and a detector structure that is arranged in a focal surface of the front optics assembly, whereby the detector structure is arranged in a curved manner in the focal surface. This enables broader fields of view, whereby it is possible to simplify the optics, for example.

Field correctors are thus no longer required. The opto-electronic imaging system may include a focal surface according to the present invention and/or a detector according to the present invention.

BRIEF DESCRIPTION OF THE DRAWINGS

FIGS. 9a to 9g illustrate the sequence for manufacturing the focal surface according to the present invention.

DETAILED DESCRIPTION

Figure 1:
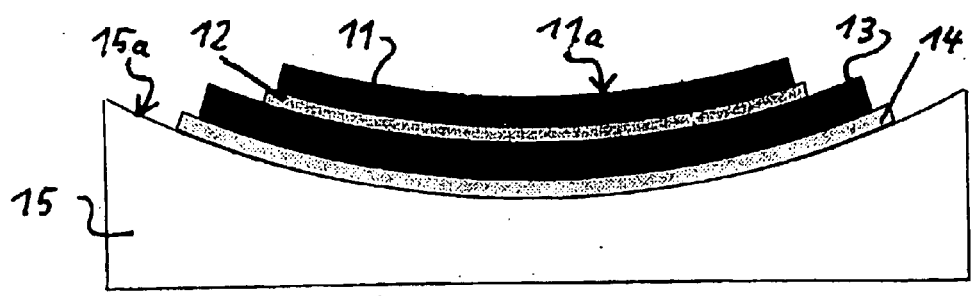
FIG. 1 is a schematic sectional view of a focal surface according to the present invention.

The following describes a first example embodiment of the present invention with reference to FIG. 1. FIG. 1 shows a schematic sectional view through a portion of the focal surface 10. The focal surface 10 includes one or more detectors 11, whereby only one detector 11 in the form of a line sensor is shown in FIG. 1. The detector 11 may be a CMOS line detector with a relatively high length/width ratio that may be, for example, approximately 40. It consists of a chip or a silicon element that is bonded to a flexible carrier substrate 13 via a first bonding layer 12. This first bonding layer 12 may be an adhesive coating that is particularly thin and has a thickness of less than approximately 10 $\mu$m, e.g., approximately 1 to 2 $\mu$m. The carrier substrate 13 may be made of a flexible foil with a thickness of approximately 50 to 100 $\mu$m. The flexible carrier substrate 13 with the chip on it is bonded to a detector carrier 15 by a second bonding layer 14 that is an adhesive coating as well. Thus, the detector carrier 15 forms a focal surface backplate for carrying numerous detector modules or elements with detectors 11. At its surface 15a, the detector carrier 15 includes a curvature to which the detector 11 is adapted. That is, the detector 11 is curved as well or is flexible. Due to its curvature at its surface 11a, the detector 11, together with additional detectors that are present on the detector carrier 15, is suitable for recording a curved field of view.

The degree of curvature of the focal surface depends on the application. For a conventional wide-angle telescope or a typical reflective Schmidt telescope in an imaging system, an aperture diameter Do may be, for example, 20 cm and a focal length f may be, for example, 1 m. The opening ratio F# is, therefore: F#=f/Do=5. Varying image heights and the defocus can be calculated in relation to the field viewing angle. For example, a field viewing angle of ±3° results in an image height of 105.52 mm. At ±3°, the height differences are −1.2 mm compared to the center and at ±6° 5.35 mm. The corresponding curvatures can be obtained with the detectors 11 or focal surfaces 10 according to the present invention.

The curvature of the focal surface 10 is designed such that the wave front strikes the detectors 11 or the detector surface 11a perpendicularly. The required tolerances arise from the depth of focus δS according to the following equation:

$$\delta S = \frac{\pm \lambda}{2n \sin^2 U_m} \text{ (depth of focus)}$$

by observing the quarter-wave limit, whereby $U_m$ is the borderline beam angle and λ is the wavelength.

Figure 2:
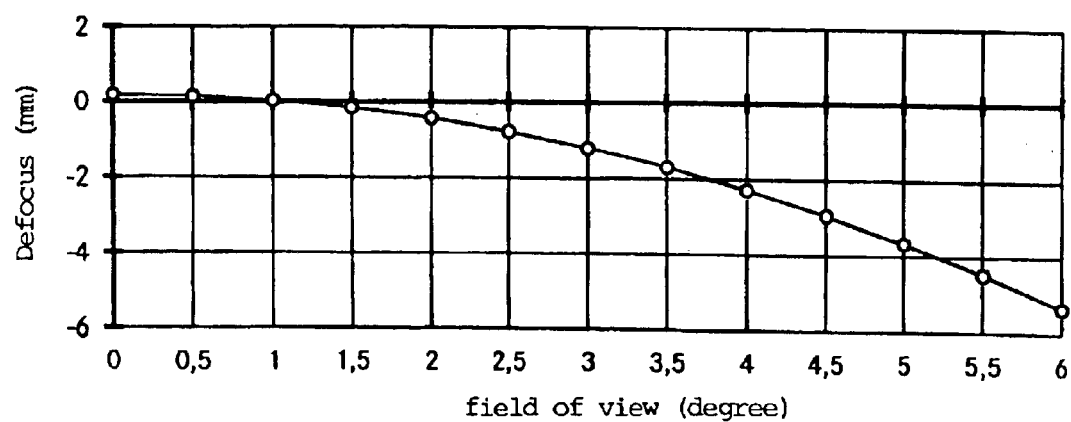
FIG. 2 illustrates a curvature of a field of view to which the focal surface is adapted.

With n=1, λ=0.65 μm and F#=5, the resultant value for the physical depth of focus δS is ±32.5 μm. Tolerances in a range of approximately 30 μm may be maintained without problem when manufacturing focal surfaces 10. The curvature of the focal surface 10 according to the example embodiment is illustrated in FIG. 2, in which the defocus in mm is plotted against the FOV in degrees, whereby the focal surface is adapted to this plot.

Figure 3:
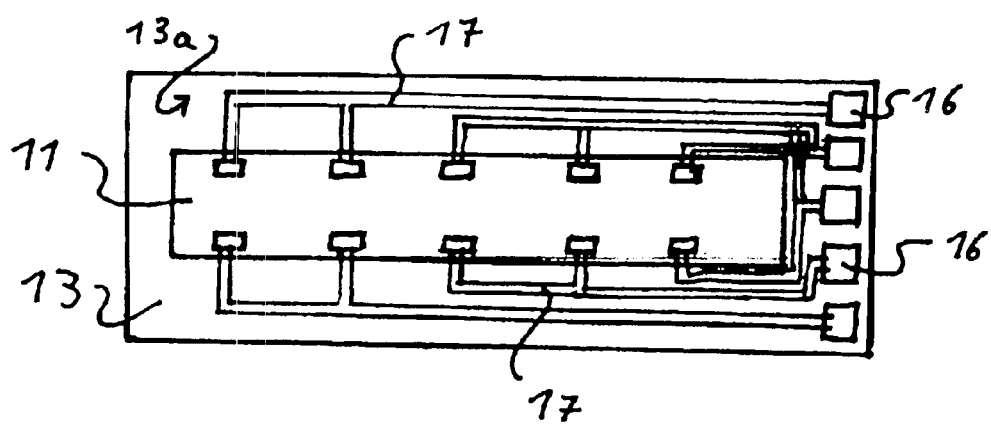
FIG. 3 is a top view of a detector module or element according to the present invention.

FIG. 3 is a schematic a top view of the detector module or line module with the detector 11 and the flexible carrier substrate 13. The surface 13a of the carrier substrate includes electrical contacts 16 as exterior connectors for the electrical connection to a control or readout electronics. The electrical contacts 16 are located on the edge along the width of the detector module. Electrical connections 17 from the chip or the detector 11 to the carrier substrate 13 are formed across the chip edge. Thus, the contacts are made by the isoplanar contacting method such that no local high pressure forces effect the extremely thin chips during the manufacturing process, such as is the case with wire bonding, for example. The electrical connections 17 may be formed, for example, by screen-printing.

CMOS-APS line detectors may be used as detectors 11 in the example embodiment according to the present invention. However, it is also possible to use CCD detectors. The detector lines may have, for example, 10,240, 8,192, 6,144, 4,096, 2,048 or 1,024 pixels. The length of the used line detectors or silicon components may be approximately 100 mm, while the width may be only approximately 3 mm, which results in the high large length/width ratio. The silicon elements or silicon discs that form the detectors 11 are thinned or reduced in their thickness to approximately 25 μm. The thickness of the detector 11 or of the actual line sensor that is supported by the carrier substrate 13 may be approximately 20 μm.

The line sensor or detector 11 with its approximately 2,000 to 10,000 pixels may include a transparent coating, not shown in FIG. 1. For this purpose, the respective CMOS line may be laminated between two foils, whereby the lower foil forms the carrier substrate 13 with the described connection structures, while the upper foil is transparent and serves only for protection purposes. This significantly simplifies the subsequent handling of the line module or the detector line on the flexible carrier substrate 13, and the sensitivity to breaking is significantly reduced for the thinned silicon chip that is formed as a monocrystal.

Figure 4:
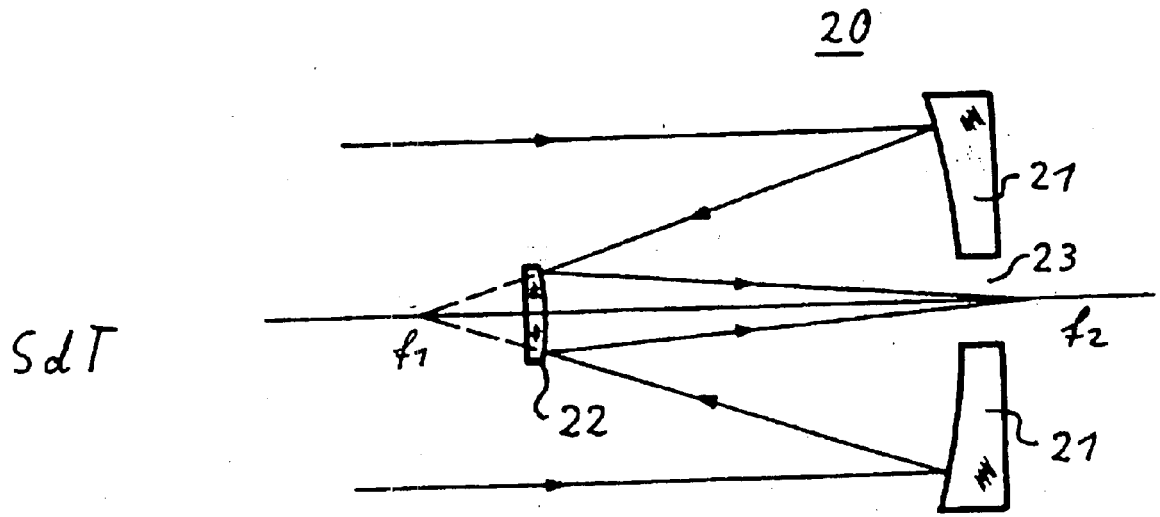
FIG. 4 illustrates a conventional Cassegrain system.

FIG. 4 shows a conventional Cassegrain system as an example of front optics that may be equipped with the curved focal surface according to the present invention in order to form an opto-electronic imaging system. With the Cassegrain system as front optics 20, the beams of a distant object strike a concave mirror 21 and are reflected in a focal point f1. Before the beams converge, a convex mirror 22 reflects the beams in a second focal point f2 through a central opening 23 in mirror 21. In the Cassegrain form, the mirror 21 is a paraboloid and the convex mirror 22 is a hyperboloid with the focal points f1 and f2. Other conventional designs of front optics together with the curved focal surfaces according to the present invention are also possible, such as the Schmidt system or the so-called Ritchey-Chrétien system.

Figure 5:
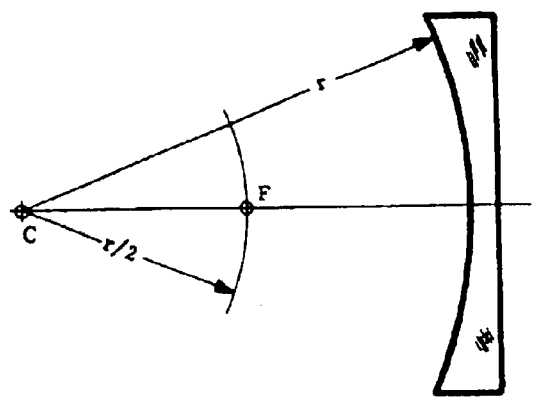
FIG. 5 illustrates a curved focal surface of a concave mirror.

In general, converging elements or concave mirrors have a high Petzval curvature with a convex shape in the direction of the incident beams as shown in FIG. 5. In general, the Petzval curvature of a reflecting surface is calculated using the equation:

$$P=2nc$$

where n is the refractive index of the medium that is in contact with the mirror and c=1/r is the curvature parameter.

Figure 6:
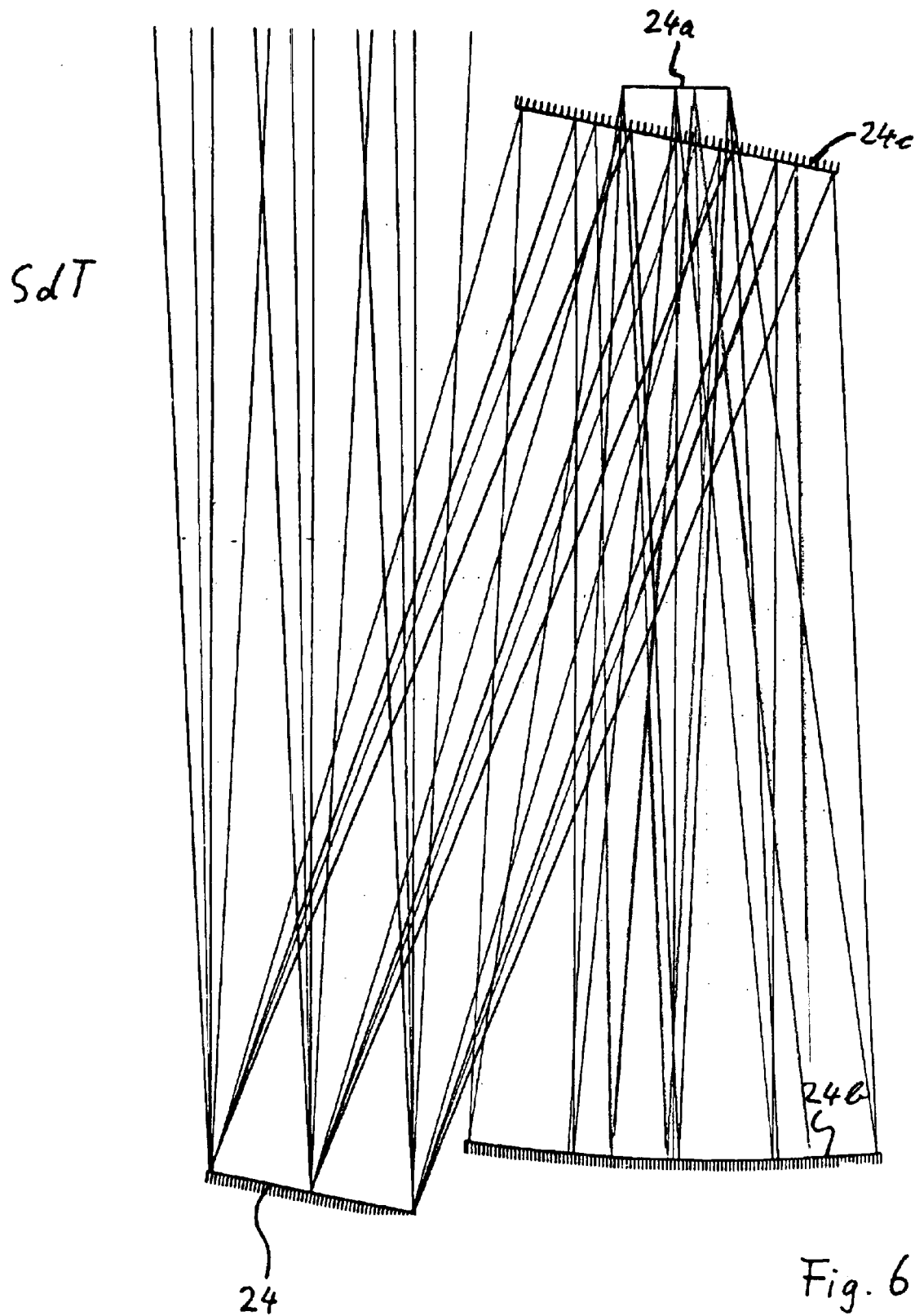
FIG. 6 illustrates a beam path of a conventional Schmidt telescope with a reflective corrector.

FIG. 6 illustrates an example of a beam path in a Schmidt telescope with a reflective corrector 24. Additionally, the telescope includes a primary mirror 24b and a folding mirror 24c. The reflective corrector 24 is used to enable a reproduction on a flat focal surface or a focal plane 24a. Other conventional systems may use transmissive correctors or corrector plates, for example, to reproduce the beams onto a flat surface as is demanded by the conventional detector technology.

The imaging system according to the present invention includes a curved focal surface, for example, according to the design described above that is coupled to conventional front optics 20 and that is adapted to the curvature of the beams or the field curvature.

Figure 7:
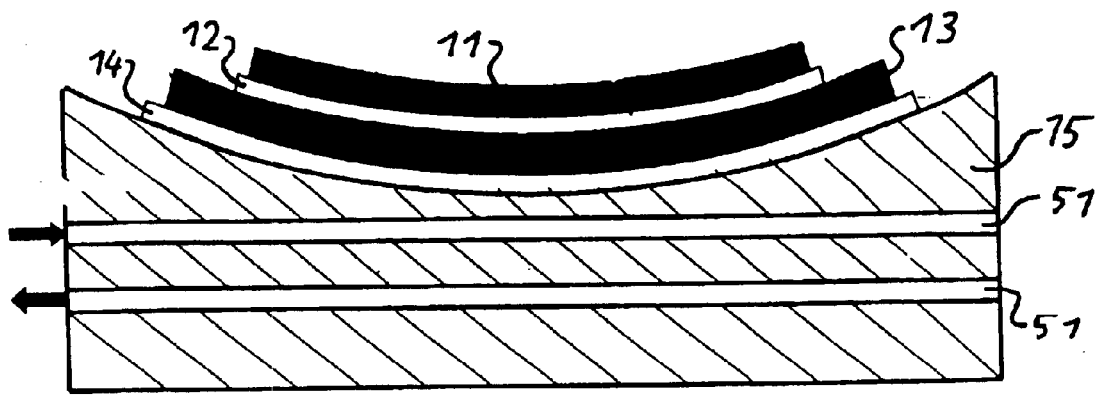
FIG. 7 is a longitudinal cross-sectional view through a focal surface having a temperature control system according to the present invention.

FIG. 7 illustrates a curved focal surface 50 according to another example embodiment. The structure of the detector module consisting of a detector 11, the carrier substrate 13 and the two adhesive layers or bonding layers 12, 14 is designed in the same manner as the example embodiment described above with reference to FIG. 1. However, the channels 51 are integrated in the detector carrier 15 or in the backplate of the focal surface, wherein the channels are designed as micro-channels or micro heat pipes. The arrangement of the channels 51 is such that the temperature distribution in the backplate or in the detector carrier 15 is as uniform as possible. Channels 51 extend in counter-current directions, that is, a bidirectional flow of the cooling medium is achieved in the detector carrier 15 or in the channels 51.

Figure 8:
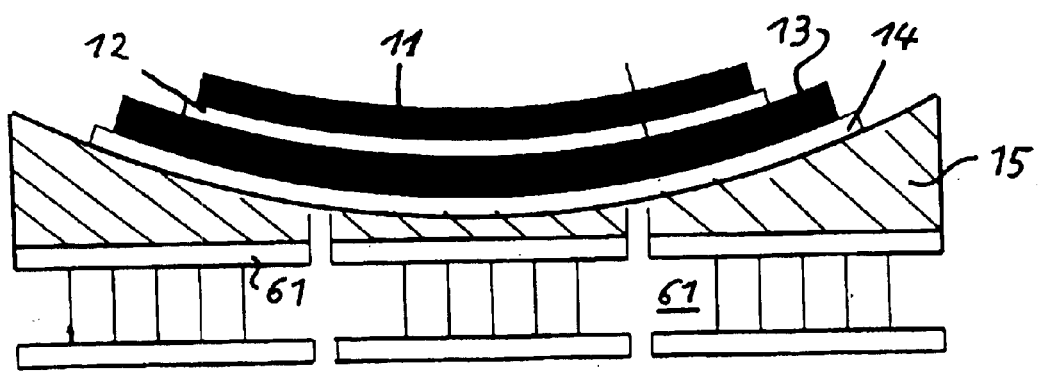
FIG. 8 is a longitudinal cross-sectional view through a focal surface having another temperature control system according to the present invention.

FIG. 8 illustrates another variant of an implementation of a temperature control system in a focal surface 60. Peltier elements 61 are coupled to the backside of the detector carrier 15. Three to ten Peltier elements, for example, may be installed at the backplate, such that a uniform temperature distribution is ensured even under a very non-uniform distribution of the heat dissipation. This arrangement has the advantage that control is electronic, thus avoiding the need for pumps, for example. Furthermore, an otherwise necessary heat discharge to the environment as well as the sealing of cooling circulations is avoided.

Temperature control is performed using calculation programs taking into account temperature-dependent material properties. The additional structure on the detector carrier 15 is the same as that described above with reference to FIGS. 1 and 7.

The focal surfaces 50 and 60 with a temperature control system according to FIGS. 7 and 8 are coupled, for example, to a Schmidt telescope as the front optics 20. Due to the high flexibility of the detectors 11, it is also possible to provide the curved detector lines with a variable or adjustable curvature radius.

The temperature control system is designed such that all pixels of the line sensor in the curved structure may be maintained within a defined temperature range even under extreme external conditions such as extreme environmental temperatures or extreme light incidence across the line. For example, for the bonding layers 12 and 14 flexible pyrolitic graphite foils with coefficients of thermal conductivity of up to 600 to 800 W/mK at a thickness of 0.1 mm and a density of 1 g/cm$^3$ may be used. Furthermore, encapsulated foils that on the inside have a TPG material (thermal pyrolitic graphite) with a very high coefficient of thermal conductivity of 1200 W/mK and on the outside various potential materials such as copper, aluminum, carbon fiber or Al—SiC may be used for the detector design.

The following describes a method according to the present invention for manufacturing detectors or thin line detectors and a curved focal surface 10, 50, 60 with reference to FIGS. 9a to 9g.

First, silicon components or chips are provided that have a length of approximately 100 mm and a width of approximately 3 mm. Then, the finished, processed Si discs are thinned to a size of approximately 25 µm, that is, their thickness is reduced. The wafers or silicon elements 71 that are to be thinned are bonded to an auxiliary carrier 72. In the bonded condition, the active side 71a of the Si element 71 faces the auxiliary carrier 72 (FIG. 9a). The auxiliary carrier 72 may be a silicon or a glass wafer. An adhesive applied in liquid form or an adhesive film may be used as the interim layer 73 between the silicon element 71 and the auxiliary carrier 72. The bond should be formed without shrinkholes. The subsequent thinning process is attuned to the topography of the discs that are to be thinned. Since the line detectors are very long, e.g., 100 mm, particular attention should be paid to the thickness variation and a potential wedge error when developing the thinning process. Both, the thickness variation and the wedge error should each be less than or equal to approximately 1 to 2 µm.

The actual thinning of the approximately 700 µm thick wafer is a multi-step process from grinding to spin etching to chemical mechanical polishing (CMP). The grinding process has a very high removal rate that may be, for example, approximately 100 to 200 µm/min. However, grinding may cause erroneous spots in the crystal surface of the silicon. This is avoided with spin etching at a medium removal rate of, for example, approximately 20 to 50 µm/min, however the result may exhibit a slight waviness. CMP, on the other hand, has a very low removal rate in a range of approximately 1 to 2 µm/min but provides the highest precision. The thinning process is performed by using the most suitable process such that the required specifications can be attained with a justifiable expenditure in time.

The auxiliary carrier 72 is maintained until the line detector is placed on the carrier substrate 13 (FIG. 9b). This offers the advantage of easy handling. The silicon element 71 is in contact with the auxiliary carrier 72 with its active side 71a. The silicon element 71 or the wafer may be thinned to a thickness of less than approximately 50 µm.

Splitting the thin wafer into chips may be performed either before or after thinning. In the present case, the standard splitting procedure of sawing is not performed because of the risk of chipping the edge of the chip. Under certain conditions, the notch effect might damage the chip, which is particularly critical in the present case due to the large length/width ratio of about 40. Thus, a splitting method that leads to clean, undamaged chip edges and that yields a high amount of CMOS detector lines per wafer may be used.

When the splitting is performed before thinning, the individual chips are separated through trenches in the unthinned wafer, whereby the depth of the trenches corresponds to the desired remaining thickness of approximately 25 µm. Potential methods to create the trenches include, for example, etching methods that create vertical walls in the silicon or sawing. Under-etching that attacks the bond pads is to be observed as a critical point with both methods. It occurs during spin etching or the CMP during the thinning process as soon as the trenches lay open.

Although the etching method is more involved and requires an etching template and lithographic steps, it has the advantage of a more accurate and more uniform definition of the trench depth. Chipped edges that are caused by sawing may be cured during the thinning process.

Methods that permit clean chip edges, such as etching, may be used for splitting after the thinning. One problem, however, is the recognition of the sawing lane, since the thinned wafer points towards the carrier or auxiliary carrier 72 with its active side 71a. Solutions include the use of a mask aligner with an IR adjustment, the use of an auxiliary carrier 72 made of glass, the use of a transparent interim coating 73 (double side mask aligner) and/or the introduction of adjustment marks prior to thinning. Laser cutting may be used for splitting as alternative to etching.

The carrier wafer may be separated using a standard sawing procedure for the subsequent mounting of the thinned chips onto substrates or the carrier substrate 13.

FIG. 9a shows the auxiliary carrier 72 with the bonding or interim layers 73 thereon and the wafer or silicon element 71 to be thinned. The silicon element 71 faces the auxiliary carrier 72 with its active side 71a. The silicon element 71 is thinned in this laminate as described above.

The thin CMOS line detectors or silicon elements 71 with the auxiliary carrier 72 are mounted on flexible substrates 13. FIG. 9b shows the laminate of auxiliary carrier 72, bonding or interim layer 73 and line detector or detector mounted on the carrier substrate 13. This laminate is bonded to the carrier substrate 13 by using an adhesive coating or a bonding layer 12 (see also FIG. 1).

When mounting the thin chips, a uniformly thin, reproducible adhesive coating may be applied and thereafter the long chip may be placed onto the carrier substrate 13 in a plane-parallel configuration. This creates a uniformly thin, low-stress bonding joint with a thickness of less than approximately 10 µm, such as, for example, approximately 1 to 2 µm.

The auxiliary carrier 72 or the carrier chip together with the bonding or interim layer 73 may be removed leaving no residue. It should be ensured that no residue remains and that no chemical reaction occurs with the pad metallization.

Flexible foils that later allow for the mounting in a curved surface of a FP backplate or a focal surface backplate may be used as carrier substrates 13.

As an alternative to the construction via a flexible foil as an interim carrier, the line detector may also be mounted directly, that is, without auxiliary carrier, onto the FPA carrier or focal surface carrier.

FIG. 9c is a schematic sectional view of the carrier substrate 13 with the line detector 11 present thereon and its electrical contacts 16a. The auxiliary carrier 72 (FIG. 9b) is already removed.

The attachment of the contacts is performed in the next step. Isoplanar contacting is performed for this purpose. In comparison to the micro-electronics typical process of wire-bonding, this has the advantage that no high local pressure forces of a bonding die can lead to the destruction of the extremely thin chip.

With isoplanar contacting, the electrical contacts of chips or the contacts 16a to the substrate are pulled over the chip edge. FIGS. 9d and 9e show a section view and a top view of a scheme for isoplanar contacting of the detector 11. The detector line or the detector 11 is mounted on the carrier substrate 13, which may be a substrate foil, by a bonding layer 12, which may be an adhesive. The electrical contacts 16 or the external contacts may be located in the edge section of the carrier substrate 13. Electrical connectors 17 lead from the chip to the substrate across the chip edge (see also FIG. 3).

The electrical connectors 17 may be formed by screen printing technology, for example.

In an optional test method, substrates and wafers may be designed and manufactured to contain passive test structures, such as Kelvin or Daisy-chain structures. The contacts are printed by varying and optimizing electrically conducting pastes. Thereafter, the resistance of the contact is analyzed with regard to an admissible contact from the CMOS line detector to the substrate. Additional analysis is performed with regard to the influence of the chip edge on the insulation resistance, the printability, breaks in the conductors due to temperature influences, etc.

Figure 9F:
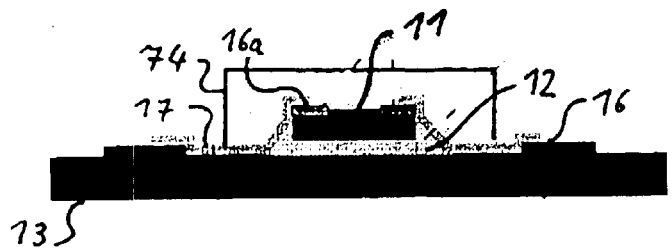
Figure 9G:
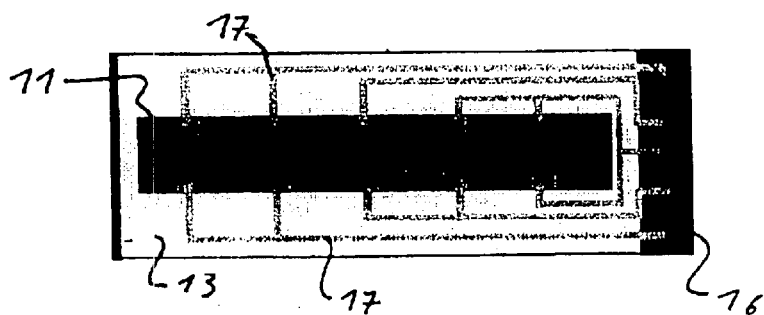

Then, the detector 11 with the structures bonded to it is provided with a transparent coating 74. The CMOS line may be laminated between two foils. FIGS. 9f and 9g show the detector 11 with the carrier substrate 13 located underneath it and the transparent coating 74 located on the top side of the detector 11. The carrier substrate 13 is formed by a bottom foil or carrier foil that contains the connection structures. The coating 74 is a top foil that is transparent and serves protective purposes. This significantly simplifies the subsequent handling of the line module that is formed by the detector line or the detector 11 on the flexible substrate 13. The electrical connections 17 and external connections or electrical contacts 16 are described above.

Figure 10:
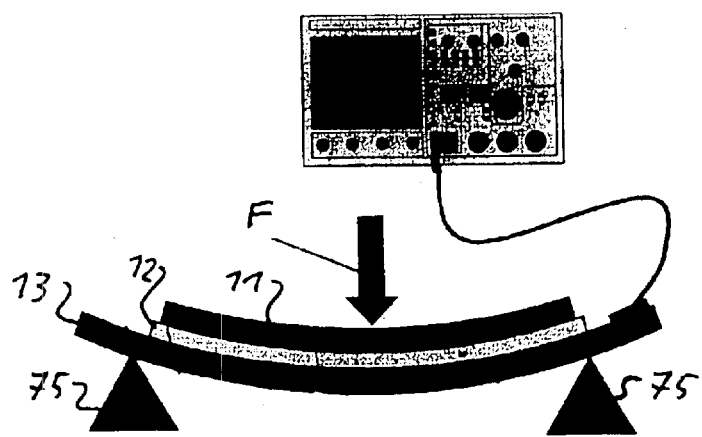
FIG. 10 illustrates a focal surface having a variable curvature radius according to the present invention.

FIG. 10 shows an arrangement for establishing differing curvature radiuses in a detector 11 or detector element for opto-electronic imaging systems that has been made according to the method described above. With this method, the detector module that consists of the detector 11, the bonding layer 12 and the carrier substrate 13 is supported from the rear side in its edge sections through support elements 75, while a force F is applied from the opposite side by an actuator substantially in the center of the detector 11. It is also possible, for example, to provide the detector carrier 15 (FIG. 1) with devices or actuators for adjusting the curvature of its surface 15a. The flexible detector 11 according to the present invention may be adapted to various curvatures and thus, the entire focal surface 10 with the detector 11 may be adapted in accordance with the respective requirements of the optics and the environmental conditions.

In FIG. 10, the arrangement is shown as a test structure for testing curved or bendable detectors 11. During the test, the signals from the shift register of the detector 11 are read out, the functionality of the line modules verified and analyzed for potential errors while the curvature radius of the line module is varied.

After the optional test, the line module, that is, the detector 11 that is mounted to the carrier substrate 13, is placed into the carrier 15 for the focal surface or detector. This line module should be assembled exactly. The line or detector module that is mounted to the detector carrier 15 is shown in FIG. 1 and is described above. When fitting the detector module and adapting the curvature of the detector carrier 15, the respective requirements such as lateral and vertical tolerances, dependability with regard to temperature, acceleration, etc, light resistance, etc. are observed. With regard to adhering to the curvature radius, deviations of approximately 30 $\mu$m are permissible as tolerances, as has been described above. These tolerances can be easily observed because the individual thicknesses of the various layers of the line module are within the $\mu$m range (detector line approximately 20 $\mu$m, substrate foil or carrier substrate 13 approximately 50 to 100 $\mu$m, adhesive layer less than approximately 10 $\mu$m).

After fitting the line module into the detector carrier 15, the electrical connections to the control and read out electronics are formed. For this purpose, a dependable mechanical and electrical attachment of the connection element on the line element is provided.

Such a complete FPA module, that is, a detector module connected to a detector carrier 15, is tested for its functionality. The dependability is incrementally increased by varying the test parameters. Especially taken into consideration are conditions that are encountered in the field of space travel, such as vibrations, accelerations, temperature, temperature gradients, temperature changes, humidity, irradiation or the effect of light, etc. The modules may be incrementally optimized according to their respective applications.

Through the present invention, and particularly through the construction technology according to the present invention of curved focal surfaces, optical instruments, especially space instruments with a broad FOV and a broad range of focal lengths are simplified. Also, in other fields of application, the front optics may be designed significantly simpler, because the requirement for a planar reproduction onto the semi-conductor detectors may be avoided.

Field correctors may be eliminated, which enables the creation of new telescope designs as well as instrument designs with an active or adaptive control of the shape of the focal plane that may be employed in place of or in combination with the active or adaptive optics.

Front optics, such as telescopes or objectives may be easily implemented, particularly for wide visual fields of reflective telescopes. An imaging system according to the present invention with the focal surface described herein has a lower thermo-mechanical sensitivity or a greater robustness than conventional systems. The results are low transmission losses and a broadband spectral transmission range. Active or adaptive control of the telescope optics may be complemented by methods that change the position of the detectors in the optical incident direction, for example. A further result is a more cost-effective image recording system, because the optics with a greater FOV and reduced distortions may be significantly simplified.

What is claimed is:

1. A focal surface for an opto-electronic imaging system, comprising:

at least one detector formed of at least one solid state element and configured to record an image, the at least one detector being flexible, at least one of the focal surface and the at least one detector having a curvature for recording a curved image plane;
a detector carrier configured to hold the at least one detector; and
a flexible carrier substrate, the at least one solid state element being flexible, thinned, and connected to the flexible carrier substrate;
wherein the at least one solid state element has a maximum thickness of approximately 20 $\mu$m.

2. The focal surface according to claim 1, wherein the at least one detector includes a thinned silicon wafer, the at least one detector being arranged on the focal surface in a curved manner.

3. The focal surface according to claim 1, wherein the at least one detector is formed using an auxiliary carrier connected to the at least one solid state element for thinning the at least one solid state element, the auxiliary carrier being at least one of removable and removed after the at least one solid state element is thinned.

4. The focal surface according to claim 1, wherein the at least one detector includes at least one of a CMOS line detector, a CCD line detector, a solid state line detector and a two-dimensional array detector.

5. The focal surface according to claim 1, further comprising an actuator configured to vary the curvature.

6. A focal surface for an opto-electronic imaging system, comprising:
at least one detector formed of at least one solid state element and configured to record an image, the at least one detector being flexible, at least one of the focal surface and the at least one detector having a curvature for recording a curved image plane;
a detector carrier configured to hold the at least one detector;
a flexible carrier substrate, the at least one solid state element being flexible, thinned, and connected to the flexible carrier substrate; and
a temperature control system configured to maintain the at least one detector within a predefined temperature range, the detector carrier including at least one channel or being coupled to at least one peltier element.

7. A detector for image recording, comprising:
a thinned, flexible solid state element; and
a flexible carrier substrate, the solid state element being connected to the flexible carrier substrate;
wherein the detector is flexible; and
wherein the solid state element has at least one of a thickness of approximately 10 $\mu$m to 20 $\mu$m and a length-to-width ratio of approximately 20 to 60.

8. The detector according to claim 7, wherein the length-to-width ratio is approximately 40.

9. An opto-electronic imaging system, comprising a focal surface, the focal surface including:
at least one detector formed of at least one solid state element and configured to record an image, the at least one detector being flexible, at least one of the focal surface and the at least one detector having a curvature for recording a curved image plane;
a detector carrier configured to hold the at least one detector; and
a flexible carrier substrate, the at least one solid state element being flexible, thinned, and connected to the flexible carrier substrate;
wherein the at least one solid state element has a maximum thickness of approximately 20 $\mu$m.

10. The opto-electronic imaging system according to claim 9, wherein the at least one detector includes a thinned silicon wafer, the at least one detector being arranged on the focal surface in a curved manner.

11. The opto-electronic imaging system according to claim 9, wherein the at least one detector is formed using an auxiliary carrier connected to the at least one solid state element for thinning the at least one solid state element, the auxiliary carrier being at least one of removable and removed after the at least one solid state element is thinned.

12. The opto-electronic imaging system according to claim 9, wherein the at least one detector includes at least one of a CMOS line detector, a CCD line detector, a solid state line detector and a two-dimensional array detector.

13. The opto-electronic imaging system according to claim 9, further comprising an actuator configured to vary the curvature.

14. An opto-electronic imaging system comprising:
a focal surface, the focal surface including:
at least one detector formed of at least one solid state element and configured to record an image, the at least one detector being flexible, at least one of the focal surface and the at least one detector having a curvature for recording a curved image plane;
a detector carrier configured to hold the at least one detector; and
a flexible carrier substrate, the at least one solid state element being flexible, thinned, and connected to the flexible carrier substrate; and
a temperature control system configured to maintain the at least one detector within a predefined temperature range, the detector carrier including at least one channel or being coupled to at least one peltier element.

15. An opto-electronic imaging system, comprising a detector, the detector including:
a thinned, flexible solid state element; and
a flexible carrier substrate, the solid state element being connected to the flexible carrier substrate;
wherein the detector is flexible; and
wherein the solid state element has at least one of a thickness of approximately 10 $\mu$m to 20 $\mu$m and a length-to-width ratio of approximately 20 to 60.

16. The opto-electronic imaging system according to claim 15, wherein the length-to-width ratio is approximately 40.

17. An opto-electronic imaging system, comprising:
at least one of a focal surface and a detector;
the focal surface including:
at least one detector formed of at least one solid state element and configured to record an image, the at least one detector being flexible, at least one of the focal surface and the at least one detector having a curvature for recording a curved image plane;
a detector carrier configured to hold the at least one detector; and
a flexible carrier substrate, the at least one solid state element being thinned and connected to the flexible carrier substrate;
the detector including:
a thinned, flexible solid state element; and
a flexible carrier substrate, the solid state element being connected to the flexible carrier substrate;
wherein the detector is flexible;
wherein the at least one solid state element has a maximum thickness of approximately 20 $\mu$m; and
wherein the detector is bonded to the flexible carrier substrate via a first bonding layer, and the flexible carrier substrate is bonded to the detector carrier by a second bonding layer, the detector carrier having a curvature.

* * * * *

UNITED STATES PATENT AND TRADEMARK OFFICE
CERTIFICATE OF CORRECTION

PATENT NO. : 6,849,843 B2
DATED : February 1, 2005
INVENTOR(S) : Ansorge et al.

It is certified that error appears in the above-identified patent and that said Letters Patent is hereby corrected as shown below:

Title page,
Item [75], Inventor, change "Fank Ansorge" to -- Frank Ansorge --.

Column 5,
Line 47, change "forces effect" to -- forces affect --.

Signed and Sealed this

Twenty-second Day of November, 2005

JON W. DUDAS
*Director of the United States Patent and Trademark Office*